(12) United States Patent
Zhang et al.

(10) Patent No.: US 10,191,310 B2
(45) Date of Patent: Jan. 29, 2019

(54) POWER CONVERSION CIRCUIT FOR SWITCHING VIEWING ANGLE AND LIQUID CRYSTAL DISPLAY

(71) Applicant: Infovision Optoelectronics (Kunshan) Co., Ltd., Kunshan City, Jiangsu Province (CN)

(72) Inventors: Dalei Zhang, Kunshan (CN); Yongxin Ruan, Kunshan (CN); Qingbai Lv, Kunshan (CN)

(73) Assignee: INFOVISION OPTOELECTRONICS (KUNSHAN) CO., LTD., Kunshan, Jiangsu Province (CN)

( * ) Notice: Subject to any disclaimer, the term of this patent is extended or adjusted under 35 U.S.C. 154(b) by 279 days.

(21) Appl. No.: 15/294,726

(22) Filed: Oct. 15, 2016

(65) Prior Publication Data

US 2017/0108724 A1  Apr. 20, 2017

(30) Foreign Application Priority Data

Oct. 16, 2015 (CN) .......................... 2015 1 0672092

(51) Int. Cl.
*G02F 1/13* (2006.01)
*G02F 1/133* (2006.01)
(Continued)

(52) U.S. Cl.
CPC ........ *G02F 1/13306* (2013.01); *G02F 1/1323* (2013.01); *G02F 1/1368* (2013.01); *G02F 1/134309* (2013.01); *G09G 3/00* (2013.01); *H02J 1/10* (2013.01); *H03K 3/00* (2013.01); *G02F 1/133514* (2013.01); *G02F 1/134363* (2013.01); *G02F 2001/134372* (2013.01); *G02F 2001/134381* (2013.01); *G02F 2201/121* (2013.01); *G02F 2201/123* (2013.01); *G02F 2201/128* (2013.01)

(58) Field of Classification Search
CPC ............. G02F 1/1323; G02F 1/134363; G02F 2001/134381
See application file for complete search history.

(56) References Cited

U.S. PATENT DOCUMENTS

| 3,882,331 | A |   | 5/1975 | Sasaki |           |
|-----------|---|---|--------|--------|-----------|
| 5,952,991 | A |   | 9/1999 | Akiyama |          |
| 2010/0128189 | A1 | * | 5/2010 | Teranishi | ............... G02F 1/1323 349/33 |

FOREIGN PATENT DOCUMENTS

| CN | 1624534 A | 6/2005 |
| CN | 1971481 A | 5/2007 |

* cited by examiner

Primary Examiner — Thanh-Nhan P Nguyen
(74) Attorney, Agent, or Firm — Cheng-Ju Chiang

(57) ABSTRACT

A power conversion circuit for switching the viewing angle of an LCD, includes an input terminal, an output terminal, a switching unit, an isolating unit, an output unit, a first power supply, a second power supply, and a third power supply. When the input terminal is provided with a low level voltage, the switching unit is switched on, the voltage of the second power supply is provided as a first DC voltage to the output terminal via the switching unit and the isolating unit. When the input terminal is provided with a high level voltage, the switching unit is switched off, the voltage of the third power supply is provided as a second DC voltage to the output terminal via the output unit and the isolating unit, wherein the second DC voltage is higher than the first DC voltage.

20 Claims, 3 Drawing Sheets

(51) Int. Cl.
  *G02F 1/1343* (2006.01)
  *G02F 1/1368* (2006.01)
  *G09G 3/00* (2006.01)
  *H02J 1/10* (2006.01)
  *H03K 3/00* (2006.01)
  *G02F 1/1335* (2006.01)

POWER CONVERSION CIRCUIT FOR SWITCHING VIEWING ANGLE AND LIQUID CRYSTAL DISPLAY

CROSS-REFERENCE TO RELATED APPLICATION

The present application is based on and claims priority of Chinese patent application No. 201510672092.2, filed on Oct. 16, 2015. The entire disclosure of the above-identified application is hereby incorporated by reference herein and made a part of this specification.

TECHNICAL FIELD

The present application relates to liquid crystal display technology, and more particularly to a power conversion circuit for switching viewing angle of a liquid crystal display (LCD).

BACKGROUND

Liquid crystal display (LCD) has the advantages of portability, low power consumption, low radiation, and low cost, and has been widely used in various portable electronic devices such as notebooks, tablet PCs, mobile phones, televisions, video cameras, and the like.

Wide viewing angle is the mainstream development of an LCD. Presently, portable electronic devices such as notebooks, tablet PCs, mobile phones are adopted with wide viewing angle technology, so that users can see images on the LCD without distortion when viewed from different viewing angles. However, when using a portable electronic device in public places, the wide viewing angle design of conventional LCD cannot effectively protect the privacy of the user, and the images displayed on the LCD can be easily viewed by a bystander from a squint direction. Thus, in addition to the needs for a wide viewing angle, LCDs capable of being adjusted to a narrow viewing angle are thus developed in order to protect modern people's needs of privacy in public places.

The LCD generally includes a TFT (thin film transistor) array substrate, a CF (color filter) substrate, and a liquid crystal layer disposed between the TFT array substrate and the CF substrate. Currently, LCDs having wide viewing angle includes IPS (in-plane switching) type LCDs and FFS (fringe field switching) type LCDs. For an IPS or FFS type LCD, the pixel electrode and the common electrode are formed in the TFT array substrate. In order to control the viewing angle of the LCD, a viewing angle control electrode is formed in the CF substrate for controlling the viewing angle of the LCD. By applying an AC (alternating current) voltage to the control electrode, an electric filed is generated between the array substrate and the CF substrate to cause the liquid crystal molecules in the liquid crystal layer to rotate, whereby the viewing angle of the LCD is changed.

Referring to FIG. 1, the AC voltage applied to the control electrode may be generated by an oscillating circuit 6. The oscillating circuit 6 receives a DC (direct current) voltage from a programmable power IC 5, and then generates and outputs an AC voltage based on the received DC voltage. Since the amplitude of the AC voltage is determined by the magnitude of the DC voltage, when the programmable power IC 5 generates and outputs DC voltages with different magnitudes to the oscillating circuit 6, the oscillating circuit 6 will generate AC voltages having different amplitudes based on these DC voltages. The generated AC voltages having different amplitudes can then be applied to the control electrode to modulate the viewing angle of the LCD, so that the LCD can obtain different viewing angles. In FIG. 1, it is the programmable power IC 5 acting as a power conversion circuit for providing different DC voltages. However, the power conversion circuit is packaged in a programmable power IC, its driving ability is limited, and the cost is relatively high.

SUMMARY

The object of the present application is to provide a power conversion circuit for switching the viewing angle of an LCD.

In one aspect, the present application provides a power conversion circuit for switching the viewing angle of an LCD. The power conversion circuit includes an input terminal, an output terminal, a switching unit, an isolating unit, an output unit, a first power supply, a second power supply, and a third power supply. The switching unit is connected to the input terminal, the isolating unit, the output unit, the first power supply, and the second power supply. The isolating unit is connected to the output terminal, the switching unit, and the output unit. The output unit is connected to the switching unit, the isolating unit, and the third power supply. When the input terminal is provided with a low level voltage, the switching unit is switched on, the voltage of the second power supply is provided as a first DC voltage to the output terminal via the switching unit and the isolating unit. When the input terminal is provided with a high level voltage, the switching unit is switched off, the voltage of the third power supply is provided as a second DC voltage to the output terminal via the output unit and the isolating unit, wherein the second DC voltage is higher than the first DC voltage.

In another aspect, the present application provides an LCD. The LCD includes a first substrate, a second substrate, a liquid crystal layer, a power conversion circuit, and an AC voltage generator. The first substrate is provided with a common electrode and a pixel electrode. The second substrate is provided with a viewing angle control electrode. The liquid crystal layer is disposed between the first substrate and the second substrate. The power conversion circuit includes an input terminal, an output terminal, a switching unit, an isolating unit, an output unit, a first power supply, a second power supply, and a third power supply. The AC voltage generator is connected between the output terminal of the power conversion circuit and the viewing angle control electrode of the second substrate. The switching unit is connected to the input terminal, the isolating unit, the output unit, the first power supply, and the second power supply. The isolating unit is connected to the output terminal, the switching unit, and the output unit. The output unit is connected to the switching unit, the isolating unit, and the third power supply. When the input terminal is provided with a low level voltage, the switching unit is switched on, the voltage of the second power supply is provided as a first DC voltage to the output terminal via the switching unit and the isolating unit. When the input terminal is provided with a high level voltage, the switching unit is switched off, the voltage of the third power supply is provided as a second DC voltage to the output terminal via the output unit and the isolating unit, wherein the second DC voltage is higher than the first DC voltage. Each of the first DC voltage and the second DC voltage is fed into the AC voltage generator, and the AC voltage generator transforms each of the first DC voltage and the second DC voltage into an AC voltage which is applied to the viewing angle control electrode of the second substrate to control the viewing angle of the LCD.

When the input terminal is provided with low level voltage or high level voltage, the output terminal of the power conversion circuit can output different DC voltages, such as, a first DC voltage and a second DC voltage which is different from the first DC voltage. When a DC voltage is fed into the AC voltage generator, the AC voltage generator can transform the DC voltage into an AC voltage. When different AC voltages generated by the AC voltage generator based on the DC voltages are applied to the viewing angle control electrode of the LCD, the viewing angle of the LCD is adjusted and regulated. It can be seen that, the power conversion circuit is simple in structure, its driving ability is strong, and the cost is low.

Other novel features and advantages will become more apparent from the following detailed description when taken in conjunction with the accompanying drawings.

DETAILED DESCRIPTION OF PREFERRED EMBODIMENTS

Exemplary embodiments of the present application are described in detail with reference to the accompanying drawings, but the present application is not limited to the following embodiments.

Figure 1:
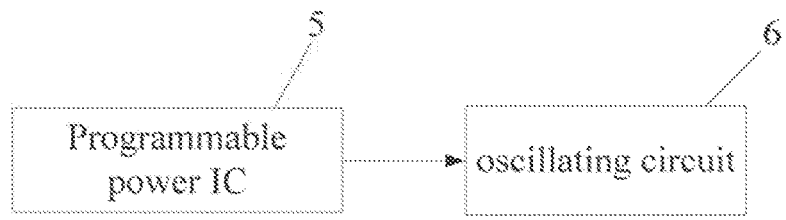
FIG. 1 is a diagram of a power supply circuit according to related art.
Figure 2:
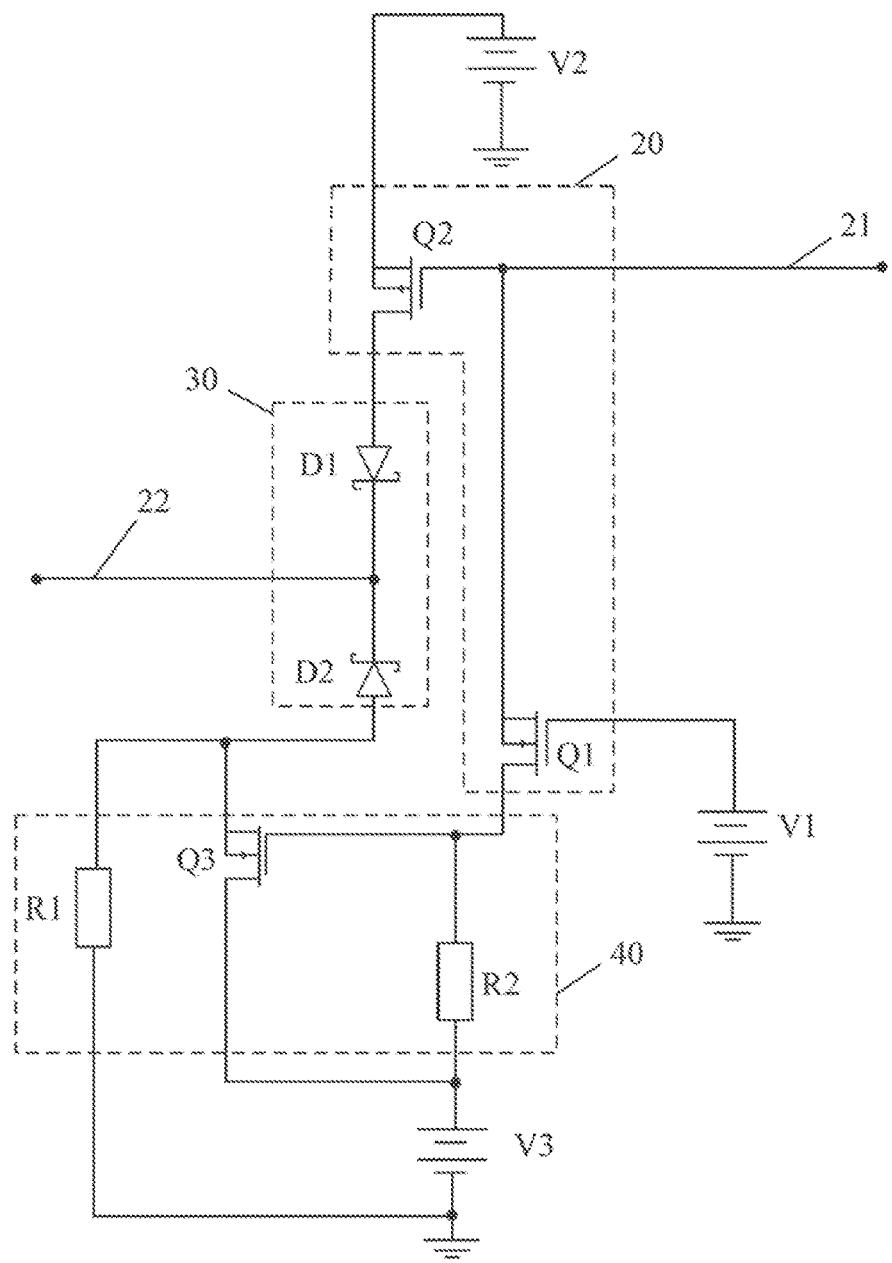
FIG. 2 is a circuit diagram of a power conversion circuit for switching viewing angle of an LCD according to an embodiment of the present application.

FIG. 2 is a circuit diagram of a power conversion circuit for switching viewing angle of an LCD according to an embodiment of the present application. As shown in FIG. 2, in the exemplary embodiment, the power conversion circuit includes an input terminal 21, an output terminal 22, a switching unit 20, an isolating unit 30, an output unit 40, a first power supply V1, a second power supply V2, and a third power supply V3. The power supplies V1, V2, V3 are DC (direct current) power supplies.

The switching unit 20 is connected to the input terminal 21, the isolating unit 30, the output unit 40, the first power supply V1, and the second power supply V2. When the input terminal 21 is provided with a low level voltage, the switching unit 20 is switched on to control the output terminal 22 to output a first DC voltage (i.e., the voltage of the second power supply V2). When the input terminal 21 is provided with a high level voltage, the switching unit 20 is switched off, and the output terminal 22 is controlled by the output unit 40 to output a second DC voltage (i.e., the voltage of the third power supply V3) which is higher than the first DC voltage.

The isolating unit 30 is connected to the output terminal 22, the switching unit 20, and the output unit 40. The isolating unit 30 is configured to prevent reverse current from passing through the switching unit 20 and the output unit 40 respectively to the second power supply V2 and the third power supply V3, to thereby maintain the whole circuit stable.

The output unit 40 is connected to the switching unit 20, the isolating unit 30, and the third power supply V3. When the input terminal 21 is provided with a low level voltage, the switching unit 20 is switched on to control the output terminal 22 to output a first DC voltage (i.e., the voltage of the second power supply V2), and the output unit 40 prevents the electric current of the third power supply V3 from flowing towards the output terminal 22. When the input terminal 21 is provided with a high level voltage, the switching unit 20 is switched off, and the output terminal 22 is controlled by the output unit 40 to output a second DC voltage (i.e., the voltage of the third power supply V3) which is higher than the first DC voltage.

Specifically, the switching unit 20 includes a first transistor Q1 and a second transistor Q2. The isolating unit 30 includes a first diode D1 and a second diode D2. The output unit 40 includes a third transistor Q3, a first resistor R1, and a second resistor R2.

Each transistor Q1, Q2, Q3 includes a gate electrode, a first conductive electrode, and a second conductive electrode. The first conductive electrode may be a source electrode of the transistor, and the second conductive electrode may be a drain electrode of the transistor. Alternatively, the first conductive electrode may be a drain electrode of the transistor, and the second conductive electrode may be a source electrode of the transistor.

The gate electrode of the first transistor Q1 is connected to the first power supply V1, the first conductive electrode of the first transistor Q1 is connected to the input terminal 21, and the second conductive electrode of the first transistor Q1 is connected to the gate electrode of the third transistor Q3.

The gate electrode of the second transistor Q2 is connected to the input terminal 21, the first conductive electrode of the second transistor Q2 is connected to the second power supply V2, and the second conductive electrode of the second transistor Q2 is connected to the anode of the first diode D1.

The gate electrode of the third transistor Q3 is connected to the second conductive electrode of the first transistor Q1, the first conductive electrode of the third transistor Q3 is connected to the anode of the second diode D2, and the second conductive electrode of the third transistor Q3 is connected to the third power supply V3.

The anode of the first diode D1 is connected to the second conductive electrode of the second transistor Q2, and the cathode of the first diode D1 is connected to the output terminal 22.

The anode of the second diode D2 is connected to the first conductive electrode of the third transistor Q3, and the cathode of the second diode D2 is connected to the output terminal 22.

The first resistor R1 is connected between the first conductive electrode of the third transistor Q3 and the ground. The second resistor R2 is connected between the gate electrode of the third transistor Q3 and the third power supply V3.

In the exemplary embodiment, the voltage of the first power supply V1 and the voltage of the second power supply V2 are equal. The voltage of the third power supply V3 is greater than the voltages of the first power supply V1 and the second power supply V2. The high level voltage of the input terminal 21 and the voltages of the first power supply V1 and the second power supply V2 are greater than the minimal gate-source voltage (Vgs) needed to be applied between the gate electrode and the source electrode when the first transistor Q1 and the second transistor Q2 are turned on. That is, the high level voltage of the input terminal 21 and the voltages of the power supplies V1, V2 are greater than the threshold voltages of the transistors Q1, Q2. The voltage of the third power supply V3 is in the range of 8~15V. The resistance of each of the resistors R1, R2 is in the range of 5~10K. Each of the transistors Q1, Q2, Q3 can be a metal-oxide-semiconductor (MOS) transistor. The diodes D1, D2 can be Schottky diode, or germanium diode with low voltage drop.

The working principle of the power conversion circuit is described in more detail hereinafter. In the exemplary embodiment, it is assumed that the voltage of each of the first power supply V1 and the second power supply V2 is 3.3V, the voltage of the third power supply V3 is 12V, each of the first transistor Q1 and the third transistor Q3 is a n-channel metal-oxide-semiconductor (NMOS) transistor, the second transistor Q2 is a p-channel metal-oxide-semiconductor (PMOS) transistor, the first conductive electrode of each transistor Q1, Q2, Q3 is a source electrode, the second conductive electrode of each transistor Q1, Q2, Q3 is a drain electrode.

When the input terminal 21 is provided with a high level voltage, e.g., 3.3V, the voltage difference between the gate electrode and the source electrode of the first transistor Q1 is 0V, and the voltage difference between the gate electrode and the source electrode of the second transistor Q2 is 0V, such that the first transistor Q1 and the second transistor Q2 are turned off. However, the electric potential of the gate electrode of the third transistor Q3 is 12V, the electric potential of the source electrode of the third transistor Q3 is 0V, and the voltage difference between the gate electrode and the source electrode of the third transistor Q3 is greater than the threshold voltage of the third transistor Q3, such that the third transistor Q3 is turned on. As a result, the output terminal 22 of the power conversion circuit outputs a second DC voltage of 12V, i.e., the voltage of the third power supply V3. The first diode D1 of the isolating unit 30 can avoid reverse current from passing the second transistor Q2 to the second power supply V2, to maintain the whole circuit stable. That is, the turning off of the first and second transistors Q1, Q2 and the turning on of the third transistor Q3 at this moment can enable the voltage of the third power supply V3 to be provided to the output terminal 22.

When the input terminal 21 is provided with a low level voltage, e.g., 0V, the voltage difference between the gate electrode and the source electrode of the second transistor Q2 is greater than the threshold voltage of the second transistor Q2, such that the second transistor Q2 is turned on. The voltage difference between the gate electrode and the source electrode of the first transistor Q1 is greater than the threshold voltage of the first transistor Q1, such that the first transistor Q1 is also turned on. Due to the turning on of the first transistor Q1, the electric potential of the gate electrode of the third transistor Q3 is almost 0V, such that the third transistor Q3 is turned off. The third transistor Q3 prevents the voltage of the third power supply V3 from being provided to the output terminal 22. As a result, the output terminal 22 of the power conversion circuit outputs a first DC voltage of 3.3V, i.e., the voltage of the second power supply V2. The second diode D2 of the isolating unit 30 can avoid reverse current from passing the third transistor Q3 to the third power supply V3, to maintain the whole circuit stable. That is, the turning on of the first and second transistors Q1, Q2 and the turning off of the third transistor Q3 at this moment can enable the voltage of the second power supply V2 to be provided to the output terminal 22.

Figure 3:
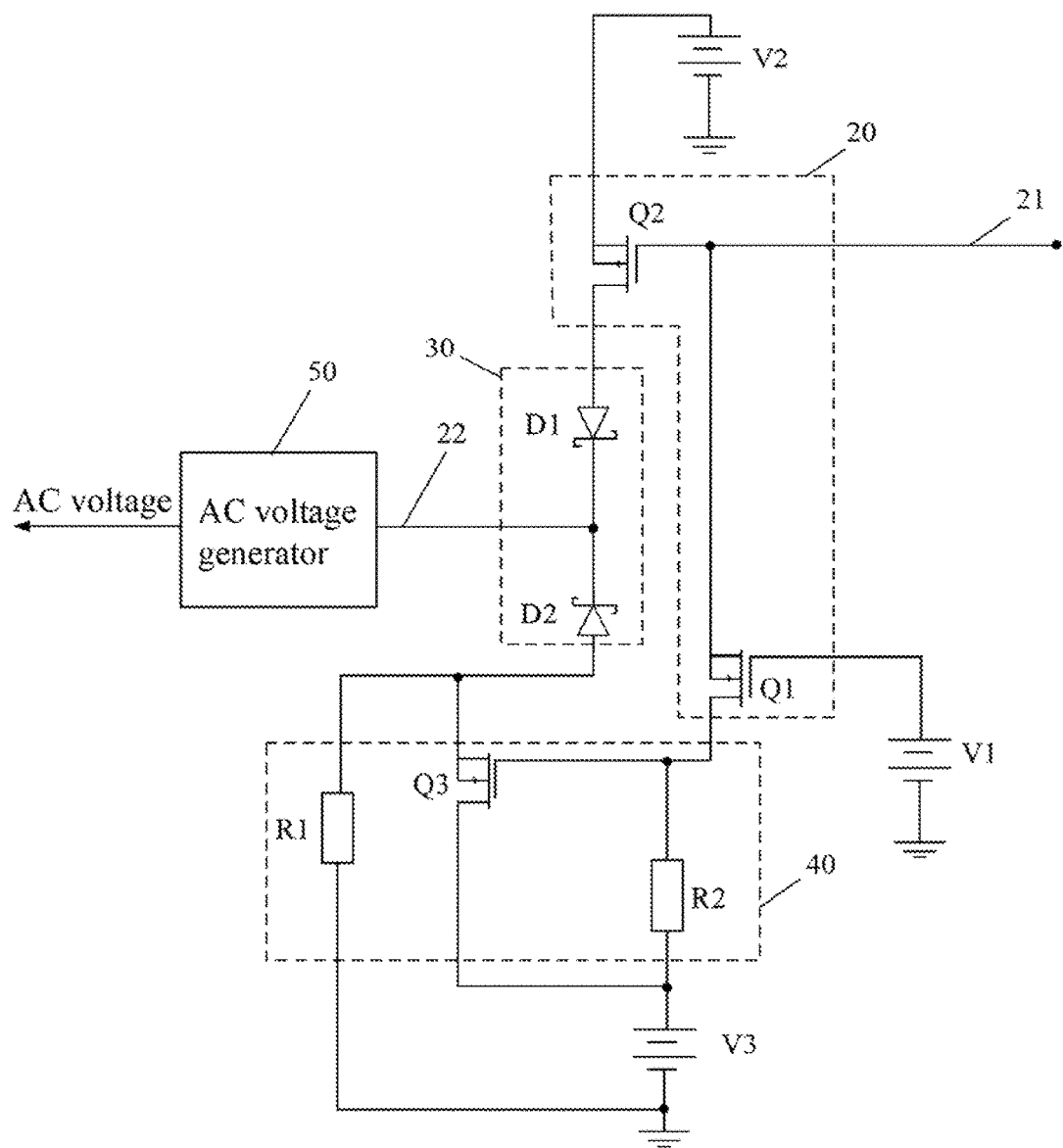
FIG. 3 is similar to FIG. 2, with an AC voltage generator further shown.

As shown in FIG. 3, the output terminal 22 is further connected to an AC (alternating current) voltage generator 50, such that the first DC voltage or the second DC voltage outputted by the output terminal 22 is fed into the AC voltage generator 50, and the AC voltage generator 50 will generate and output an AC voltage based on the received first DC voltage or the received second DC voltage. That is, the AC voltage generator 50 will output a first AC voltage based on the first DC voltage, and the AC voltage generator 50 will output a second AC voltage based on the second DC voltage, wherein the second AC voltage has an amplitude different from the first AC voltage. In the exemplary embodiment, the second DC voltage is larger than the first DC voltage, and accordingly, the second AC voltage has an amplitude larger than the first AC voltage. The AC voltage generator 50 may be an oscillating circuit.

The AC voltage outputted by the AC voltage generator 50 is then applied to the viewing angle control electrode 121 (see FIG. 4) formed on the CF substrate 12 of an LCD 1. By applying an AC voltage to the control electrode 121, the viewing angle of the LCD 1 is reduced, for example, from a wide viewing angle to a narrow viewing angle. Further, when AC voltages having different amplitudes are applied to the control electrode 121, the LCD 1 can obtain different viewing angles. For example, when the first AC voltage outputted by the AC voltage generator 50 is applied to the control electrode 121, the LCD 1 will obtain a first narrow viewing angle (e.g., 60°); when the second AC voltage outputted by the AC voltage generator 50 is applied to the control electrode 121, the LCD 1 will obtain a second narrow viewing angle (e.g., 45°). Therefore, the viewing angle of the LCD 1 can be easily controlled and regulated when the power conversion circuit outputs different DC voltages through the output terminal 22 and different AC voltages generated by the AC voltage generator 50 are applied to the control electrode 121 of the LCD 1.

Furthermore, the AC voltage generator 50 can also vary the frequency or the phase of the AC voltage, such that the viewing angle of the LCD 1 is adjusted.

From the above, when the input terminal 21 is provided with low level voltage (e.g., 0V) or high level voltage (e.g., 3.3V), the output terminal 22 of the power conversion circuit can output different DC voltages, such as, a first DC voltage (e.g., 3.3V) and a second DC voltage (e.g., 12V) which is different from the first DC voltage. When a DC voltage is fed into the AC voltage generator 50, the AC voltage generator 50 can transform the DC voltage into an AC voltage. Thus, when different AC voltages generated by the AC voltage generator 50 based on the DC voltages are applied to the viewing angle control electrode 121 of the CF substrate 12 of the LCD 1, the viewing angle of the LCD 1 is adjusted and regulated. It can be seen from the above, the power conversion circuit is simple in structure, its driving ability is strong, and the cost is low.

Figure 4:
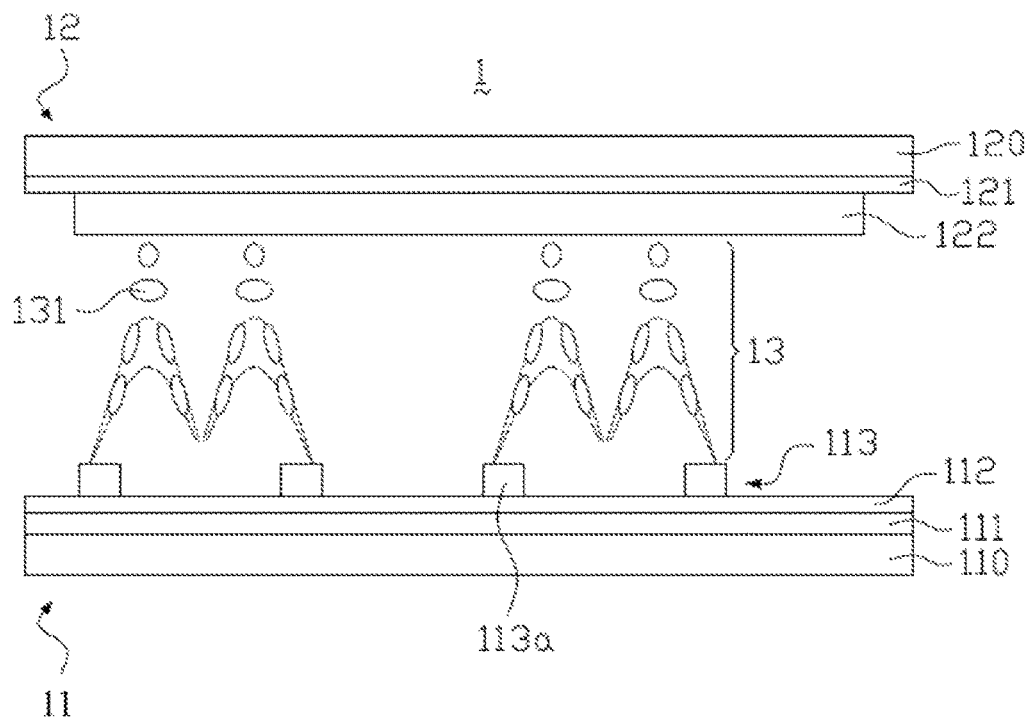
FIG. 4 schematically shows an LCD in a first viewing angle according to an embodiment of the present application.
Figure 5:
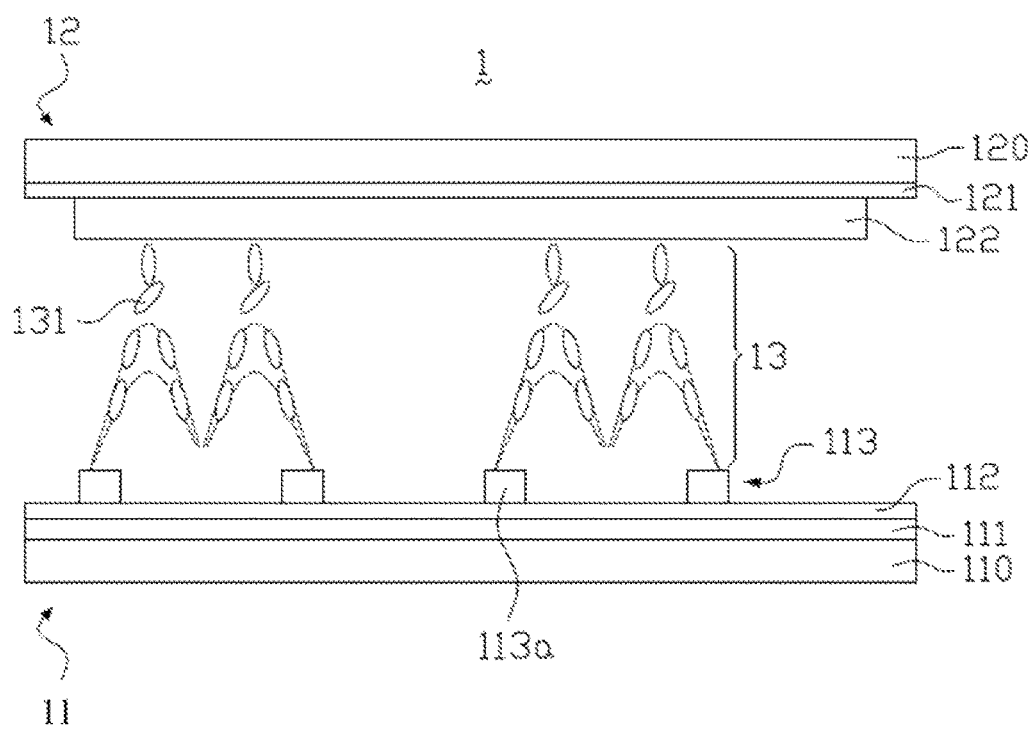
FIG. 5 schematically shows the LCD of FIG. 1 in a second viewing angle.

Referring to FIGS. 4-5, the LCD 1 includes a TFT (thin film transistor) array substrate 11, a CF (color filter) substrate 12 disposed opposite to the TFT array substrate 11, and a liquid crystal layer 13 disposed between the TFT array substrate 11 and the CF substrate 12. The LCD 1 can be an FFS type LCD or an IPS type LCD.

The TFT array substrate 11 includes a first transparent base 110, a common electrode 111, an insulating layer 112, and a pixel electrode 113. The common electrode 111, the insulating layer 112, and the pixel electrode 113 are formed on the first transparent base 110. In the embodiment, the pixel electrode 113 and the common electrode 111 are insulated from each other by the insulating layer 112. The common electrode 111 is used for inputting a common voltage (i.e., Vcom) from a driver IC (not shown) to the LCD 1, and the pixel electrode 113 is formed in each pixel of the LCD 1. The pixel electrode 113 may be patterned to form a plurality of stripe-like electrodes 113a which are arranged in parallel to each other.

The CF substrate 12 includes a second transparent base 120, a viewing angle control electrode 121, an overcoat layer 122, and a color filter layer (not shown). The viewing angle control electrode 121, the overcoat layer 122, and the color filter layer are formed on the second transparent base 120. The control electrode 121 is used for controlling the viewing angle of the LCD 1, such that the LCD 1 can adjust its viewing angle when AC voltage is applied to the control electrode 121.

The common electrode 111, the pixel electrode 113, and the control electrode 121 are transparent, and may be made of Indium Tin Oxide (ITO), Indium Zinc Oxide (IZO) or the like.

The liquid crystal layer 13 is provided with a plurality of liquid crystal molecules 131 sealed between the TFT array substrate 11 and the CF substrate 12. The liquid crystal molecules 131 are oriented in predetermined directions. Further, the liquid crystal molecules 131 may be tilted at a pretilt angle relative to the substrates 11, 12. Preferably, the pretilt angle is in the range of 0°~5°, i.e., 0°≤θ≤5°. Liquid crystal molecules are divided into positive liquid crystal molecules and negative liquid crystal molecules. In the present embodiment, the liquid crystal molecules 131 in the liquid crystal layer 13 are positive liquid crystal molecules.

Referring to FIGS. 4-5, the LCD 1 can be switched between a wide viewing angle and a narrow viewing angle when different AC voltages are applied to the viewing angle control electrode 121.

As shown in FIG. 4, when no voltage is applied to the viewing angle control electrode 121, the LCD 1 is displayed with a wide viewing angle. Under this situation, the liquid crystal molecules 131 in the liquid crystal layer 13 rotate in a plane parallel to the principal surfaces of the substrates 11, 12 under the fringe electric field generated between the common electrode 111 and the pixel electrode 113, such that the LCD 1 achieves a wide viewing angle display mode as current FFS type LCDs or IPS type LCDs.

As shown in FIG. 5, when an AC voltage is applied to the viewing angle control electrode 121, the LCD 1 is displayed with a narrow viewing angle. A vertical electric field along the vertical direction is generated between the TFT array substrate 11 and the CF substrate 12 due to the existence of the AC voltage. The vertical electric field causes the liquid crystal molecules 131 in the liquid crystal layer 13 to rotate in a plane orthogonal to the substrates 11, 12. After rotation, the liquid crystal molecules 131 in the liquid crystal layer 13 are tilted to have a greater tilt angle. As a result, lights passing through the liquid crystal molecules 131 are partially leaked to generate a light leakage phenomenon when the LCD 1 is viewed from a squint direction, the contrast of the LCD 1 is decreased, whereby the LCD 1 achieves a narrow viewing angle.

The viewing angle of the LCD 1 can be further adjusted by changing the AC voltage applied to the viewing angle control electrode 121. When different AC voltages are applied to the viewing angle control electrode 121, the LCD 1 can obtain different viewing angles. These different AC voltages may have different amplitude, frequency, or phase. By employing the power conversion circuit, the output terminal 22 can output different DC voltages, and based on different DC voltages, the AC voltage generator 50 can output different AC voltages which can then be applied to the viewing angle control electrode 121 of the LCD 1, such that the viewing angle of the LCD 1 can be easily adjusted and regulated, so as to satisfy the requirements for protecting privacy in public places.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power conversion circuit, comprising an input terminal, an output terminal, a switching unit, an isolating unit, an output unit, a first power supply, a second power supply, and a third power supply; wherein the switching unit is connected to the input terminal, the isolating unit, the output unit, the first power supply, and the second power supply;

the isolating unit is connected to the output terminal, the switching unit, and the output unit;

the output unit is connected to the switching unit, the isolating unit, and the third power supply;

when the input terminal is provided with a low level voltage, the switching unit is switched on, the voltage of the second power supply is provided as a first DC voltage to the output terminal via the switching unit and the isolating unit;

when the input terminal is provided with a high level voltage, the switching unit is switched off, the voltage of the third power supply is provided as a second DC voltage to the output terminal via the output unit and the isolating unit, wherein the second DC voltage is higher than the first DC voltage.

2. The power conversion circuit of claim 1, wherein the isolating unit is configured to prevent reverse current from passing through the switching unit and the output unit respectively to the second power supply and the third power supply.

3. The power conversion circuit of claim 1, wherein the switching unit includes a first transistor and a second transistor, the output unit includes a third transistor, each transistor includes a gate electrode, a first conductive electrode, and a second conductive electrode, the gate electrode of the first transistor is connected to the first power supply, the first conductive electrode of the first transistor is connected to the input terminal, the second conductive electrode of the first transistor is connected to the gate electrode of the third transistor, the gate electrode of the second transistor is connected to the input terminal, the first conductive electrode of the second transistor is connected to the second power supply, the second conductive electrode of the second transistor is connected to the isolating unit, the first conductive electrode of the third transistor is connected to the isolating unit, the second conductive electrode of the third transistor is connected to the third power supply.

4. The power conversion circuit of claim 3, wherein each of the first transistor and the third transistor is a n-channel metal-oxide-semiconductor transistor, the second transistor is a p-channel metal-oxide-semiconductor transistor.

5. The power conversion circuit of claim 3, wherein the isolating unit includes a first diode and a second diode, the second conductive electrode of the second transistor is connected to the anode of the first diode, the first conductive electrode of the third transistor is connected to the anode of the second diode, the cathode of the first diode is connected to the output terminal, the cathode of the second diode is connected to the output terminal.

6. The power conversion circuit of claim 3, wherein the output unit further includes a first resistor, and a second resistor, the first resistor is connected between the first conductive electrode of the third transistor and the ground, the second resistor is connected between the gate electrode of the third transistor and the third power supply.

7. The power conversion circuit of claim 1, wherein the first power supply, the second power supply, and the third power supply are DC power supplies.

8. The power conversion circuit of claim 1, wherein the voltage of the first power supply and the voltage of the second power supply are equal, the voltage of the third power supply is greater than the voltages of the first power supply and the second power supply.

9. The power conversion circuit of claim 1, wherein the voltage of the third power supply is in the range of 8~15V.

10. The power conversion circuit of claim 1, wherein the high level voltage of the input terminal and the voltages of the first power supply and the second power supply are greater than the threshold voltages of the first transistor and the second transistor.

11. A liquid crystal display (LCD), comprising:
a first substrate being provided with a common electrode and a pixel electrode;
a second substrate being provided with a viewing angle control electrode;
a liquid crystal layer being disposed between the first substrate and the second substrate;
a power conversion circuit comprising an input terminal, an output terminal, a switching unit, an isolating unit, an output unit, a first power supply, a second power supply, and a third power supply; and
an AC voltage generator being connected between the output terminal of the power conversion circuit and the viewing angle control electrode of the second substrate;
wherein the switching unit is connected to the input terminal, the isolating unit, the output unit, the first power supply, and the second power supply;
the isolating unit is connected to the output terminal, the switching unit, and the output unit;
the output unit is connected to the switching unit, the isolating unit, and the third power supply;
when the input terminal is provided with a low level voltage, the switching unit is switched on, the voltage of the second power supply is provided as a first DC voltage to the output terminal via the switching unit and the isolating unit;
when the input terminal is provided with a high level voltage, the switching unit is switched off, the voltage of the third power supply is provided as a second DC voltage to the output terminal via the output unit and the isolating unit, wherein the second DC voltage is higher than the first DC voltage; and
each of the first DC voltage and the second DC voltage is fed into the AC voltage generator, and the AC voltage generator transforms each of the first DC voltage and the second DC voltage into an AC voltage which is applied to the viewing angle control electrode of the second substrate to control the viewing angle of the LCD.

12. The LCD of claim 11, wherein the isolating unit is configured to prevent reverse current from passing through the switching unit and the output unit respectively to the second power supply and the third power supply.

13. The LCD of claim 11, wherein the switching unit includes a first transistor and a second transistor, the output unit includes a third transistor, each transistor includes a gate electrode, a first conductive electrode, and a second conductive electrode, the gate electrode of the first transistor is connected to the first power supply, the first conductive electrode of the first transistor is connected to the input terminal, the second conductive electrode of the first transistor is connected to the gate electrode of the third transistor, the gate electrode of the second transistor is connected to the input terminal, the first conductive electrode of the second transistor is connected to the second power supply, the second conductive electrode of the second transistor is connected to the isolating unit, the first conductive electrode of the third transistor is connected to the isolating unit, the second conductive electrode of the third transistor is connected to the third power supply.

14. The LCD of claim 13, wherein each of the first transistor and the third transistor is a n-channel metal-oxide-semiconductor transistor, the second transistor is a p-channel metal-oxide-semiconductor transistor.

15. The LCD of claim 13, wherein the isolating unit includes a first diode and a second diode, the second conductive electrode of the second transistor is connected to the anode of the first diode, the first conductive electrode of the third transistor is connected to the anode of the second diode, the cathode of the first diode is connected to the output terminal, the cathode of the second diode is connected to the output terminal.

16. The LCD of claim 13, wherein the output unit further includes a first resistor, and a second resistor, the first resistor is connected between the first conductive electrode of the third transistor and the ground, the second resistor is connected between the gate electrode of the third transistor and the third power supply.

17. The LCD of claim 11, wherein the first power supply, the second power supply, and the third power supply are DC power supplies.

18. The LCD of claim 11, wherein the voltage of the first power supply and the voltage of the second power supply are equal, the voltage of the third power supply is greater than the voltages of the first power supply and the second power supply.

19. The LCD of claim 11, wherein the voltage of the third power supply is in the range of 8~15V.

20. The LCD of claim 11, wherein the high level voltage of the input terminal and the voltages of the first power supply and the second power supply are greater than the threshold voltages of the first transistor and the second transistor.

* * * * *